(12) United States Patent
Espiritu et al.

(10) Patent No.: US 9,305,809 B1
(45) Date of Patent: Apr. 5, 2016

(54) INTEGRATED CIRCUIT PACKAGING SYSTEM WITH CORELESS SUBSTRATE AND METHOD OF MANUFACTURE THEREOF

(71) Applicants: Emmanuel Espiritu, Singapore (SG); Allan Pumatong Ilagan, Singapore (SG); Jeffrey David Punzalan, Singapore (SG)

(72) Inventors: Emmanuel Espiritu, Singapore (SG); Allan Pumatong Ilagan, Singapore (SG); Jeffrey David Punzalan, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 0 days.

(21) Appl. No.: 14/316,461

(22) Filed: Jun. 26, 2014

(51) Int. Cl.
| | |
|---|---|
| *H01L 23/34* | (2006.01) |
| *H01L 21/44* | (2006.01) |
| *H01L 21/48* | (2006.01) |
| *H01L 23/12* | (2006.01) |
| *H01L 23/00* | (2006.01) |
| *H01L 21/56* | (2006.01) |
| *H01L 23/538* | (2006.01) |
| *H01L 23/28* | (2006.01) |

(52) U.S. Cl.
CPC ............ *H01L 21/486* (2013.01); *H01L 21/565* (2013.01); *H01L 23/12* (2013.01); *H01L 23/28* (2013.01); *H01L 23/5384* (2013.01); *H01L 24/81* (2013.01)

(58) Field of Classification Search
CPC ........ H01L 23/12; H01L 24/81; H01L 21/565
USPC .................. 257/723, 774, 724, 686, E23.145
See application file for complete search history.

(56) References Cited

U.S. PATENT DOCUMENTS

| | | | |
|---|---|---|---|
| 4,888,450 A | 12/1989 | Lando et al. | |
| 5,497,033 A * | 3/1996 | Fillion et al. | 257/723 |
| 6,271,469 B1 * | 8/2001 | Ma et al. | 174/521 |
| 7,224,046 B2 * | 5/2007 | Abe et al. | 257/668 |
| 7,365,006 B1 | 4/2008 | Huemoeller et al. | |
| 8,592,975 B2 | 11/2013 | Pagaila | |
| 8,624,370 B2 | 1/2014 | Chi et al. | |
| 2003/0141105 A1 * | 7/2003 | Sugaya et al. | 174/256 |
| 2005/0116337 A1 * | 6/2005 | Chua et al. | 257/723 |
| 2005/0252682 A1 * | 11/2005 | Shimoto | H01L 21/4857 174/260 |
| 2014/0001635 A1 | 1/2014 | Chen et al. | |
| 2014/0070404 A1 | 3/2014 | Sheu et al. | |

* cited by examiner

*Primary Examiner* — Nitin Parekh
(74) *Attorney, Agent, or Firm* — Ishimaru & Associates LLP

(57) ABSTRACT

An integrated circuit packaging system and method of manufacture thereof includes: discrete components coupled to a top trace; vias attached to the top trace separated from the discrete components; a dielectric layer on the top trace, the discrete components, and the vias, includes a component surface formed above the discrete components, with the top trace coplanar with the dielectric layer; and system interconnects coupled to the vias for electrically connecting the top trace, the discrete components, or a combination thereof to the system interconnects.

20 Claims, 5 Drawing Sheets

US 9,305,809 B1

INTEGRATED CIRCUIT PACKAGING SYSTEM WITH CORELESS SUBSTRATE AND METHOD OF MANUFACTURE THEREOF

TECHNICAL FIELD

The present invention relates generally to an integrated circuit packaging system, and more particularly to a system for packaging integrated circuit die with a coreless substrate.

BACKGROUND ART

Electronic products have become an integral part of our daily lives. Packages of components such as semiconductor circuits, transistors, diodes, and other electronic devices have become smaller and thinner with more function and connections. In packaging components, the need for coupling components together in a reliable manner can influence the manufacturing processes.

The commercial demand for more function in less space can cause manufacturers to make compromises that decrease reliability or manufacturing yield. The additional pressure of cost reductions can pressure manufacturers to make compromises that can reduce the long term reliability of the integrated circuit products.

Thus, a need still remains for an integrated circuit packaging system that can reduce package size, support increased function, and maintain both manufacturing yield and long term reliability. In view of the extensive commercial pressures for high volume, small size, and reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: depositing a top trace on a manufacturing carrier; attaching discrete components on the top trace opposite the manufacturing carrier; mounting vias on the top trace separated from the discrete components; and forming a dielectric layer on the top trace, the discrete components, and the vias, including forming a component surface.

The present invention provides an integrated circuit packaging system, including: discrete components coupled to a top trace; vias attached to the top trace separated from the discrete components; a dielectric layer on the top trace, the discrete components, and the vias, includes a component surface, formed above the discrete components, with the top trace coplanar with the dielectric layer; and system interconnects coupled to the vias for electrically connecting the top trace, the discrete components, or a combination thereof to the system interconnects.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
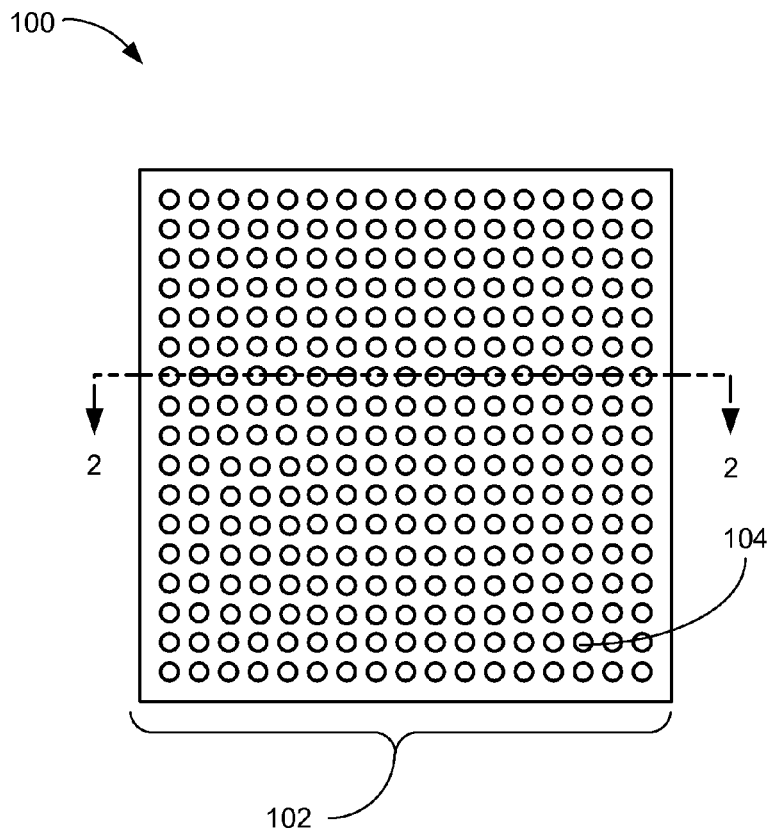
FIG. 1 is a bottom view of a first embodiment of an integrated circuit packaging system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or active surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means there is direct physical contact between elements with no intervening elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of a first embodiment of an integrated circuit packaging system 100. The bottom view of the first embodiment of the integrated circuit packaging system 100 depicts a base package 102 having an array of system interconnects 104 mounted thereon. The base package 102 can be a molded interconnect substrate having multiple embedded components.

It is understood that the number and position of the system interconnects 104 is an example only and the actual number and position can differ. By way of an example the integrated circuit packaging system 100 is shown as a square shape having an equal number of columns and rows of the system interconnects 104, but it is understood that the system interconnects 104 can form any pattern on the integrated circuit packaging system 100. A section line 2-2 can show the position and direction of view of the integrated circuit packaging system 100 in FIG. 2.

Figure 2:
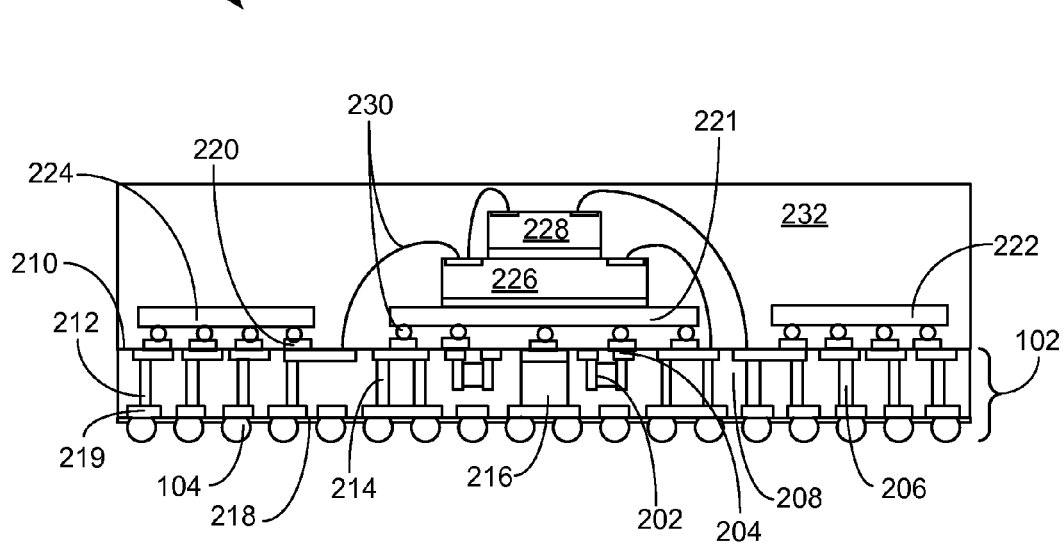
FIG. 2 is a cross-sectional view of the first embodiment of the integrated circuit packaging system along the section line 2-2 of FIG. 1.

Referring now to FIG. 2, therein is shown a cross-sectional view of the first embodiment of the integrated circuit packaging system 100 along the section line 2-2 of FIG. 1. The cross-sectional view of the first embodiment of the integrated circuit packaging system 100 depicts the base package 102, showing a two (2) metal layer substrate, having discrete components 202 coupled to a top trace 204, such as a selectively deposited conductor. The discrete components 202 can include resistors, capacitors, inductors, diodes, transistors, voltage regulators, oscillators, filters, or the like. The top trace 204 can be, copper foil layer, sputtered metal layer, or a patterned metal insert of copper, nickel, silver, gold, or a combination thereof, selectively deposited by plating, sputtering, printing, placing a pre-formed film, or the like.

Vias 206 can be attached to the top trace 204 in order to provide an electrical connection to the system interconnects 104 opposite the top trace 204. A dielectric layer 208, such as a molding compound, epoxy, sealing resin, or the like, can be molded on the top trace 204, the vias 206, and the discrete components 202. The dielectric layer 208 can form a planar surface, at a component surface 210, with the top trace 204 exposed from and planar with the component side 210.

The Vias 206 can be formed of an electrically and thermally conductive material, such as copper, tin, nickel, silver, gold, or an alloy thereof. Various embodiments of the vias 206 can include filled vias 212, open vias 214, or a heat slug 216. The filled vias 212 can provide reliable, low resistance connections between the top trace 204 and the system interconnects 104. The open vias 214 can be barrel shaped conductors, line, or curvy wall-like structures attached to the top trace 204 and can be coupled to multiple of the system interconnects 104 in order to provide a reliable connection between the top trace 204 and the system interconnects 104. The heat slug 214 can be formed of a thermally conductive material including copper foil, sputtered metal, a formed metal plug, thermal epoxy, or the like. The heat slug 214 can be in direct thermal and electrical contact with the top trace 204.

A bottom trace 219, which can be selectively used as solder pads, can be positioned between the vias 206 and the system interconnects 104. A solder resist layer 218 can optionally be formed covering the dielectric layer 208, the filled vias 212, the open vias 214, the heat slug 216, the bottom trace 219, or a combination thereof. The solder resist layer 218 can selectively be opened to expose the bottom trace 219 for use as the solder pads allowing the system interconnects 104 to connect to the solder pads.

It has been discovered that the base package 102 can provide a thin and reliable platform for assembling multiple integrated circuits in a single package format. The base package 102 is able to be tested prior to further assembly and can represent a reliable and manufacturable package substrate having the discrete components 202 for assembly of additional electronic functions.

The component surface 210 of the base package 102 can have the top trace 204 exposed for electrical connection and interconnect routing. A contact 220 can be formed on the exposed sites of the top trace 204 that will be utilized for electrical or thermal connection to the additional electronic functions. The contact 220 can comprise multiple layers of nickel and gold or an alloy that can adhere to the top trace 204.

A plurality of the contact 220 can provide a mounting surface for a first stacked integrated circuit 221, a first flip chip integrated circuit 222, a second flip chip integrated circuit 224, or a combination thereof. A second stacked integrated circuit 226 can be mounted over the first stacked integrated circuit 221. A third stacked integrated circuit 228 can be mounted over the first stacked integrated circuit 221 and the second stacked integrated circuit 226.

The first stacked integrated circuit 221 can be mounted over the component surface 210 and positioned directly above the discrete components 202, which are encapsulated in the dielectric layer 208 below the component surface 210. Component interconnects 230, such as bond wires, solder bumps, solder paste, stud bumps, solder columns, or the like, can couple the first stacked integrated circuit 221, the first flip chip integrated circuit 222, the second flip chip integrated circuit 224, the second stacked integrated circuit 226, and the third stacked integrated circuit 228 to the top trace 204 in the component surface 210. A molded package body 232 can be formed on the first stacked integrated circuit 221, the first flip chip integrated circuit 222, the second flip chip integrated circuit 224, the second stacked integrated circuit 226, the third stacked integrated circuit 228, the plurality of the contact 220, the top trace 204, and the component surface 210.

It has been unexpectedly discovered that an embodiment of the integrated circuit packaging system 100 can provide a flexible and high volume platform for integration of multiple functions, in different technologies, including integrated circuit logic, the discrete components 202, and thermal management features. The base package 102 can be fabricated in various forms and can include one or more of the discrete components 202 as part of the available function.

Figure 3:
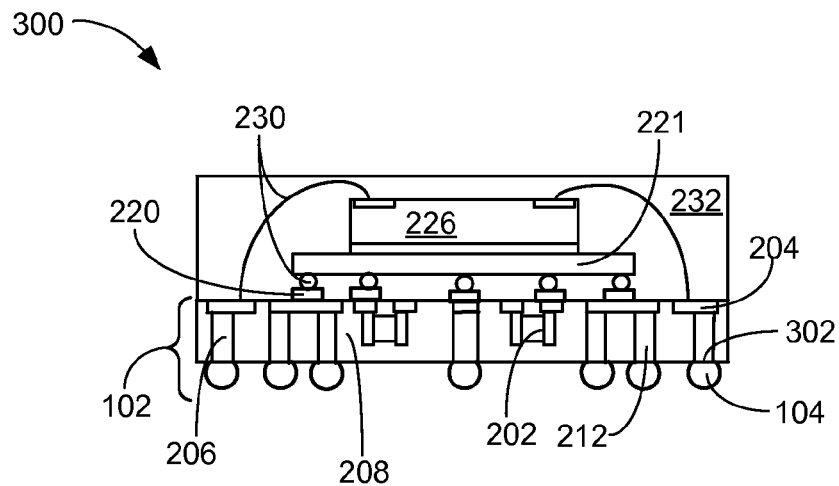
FIG. 3 is a cross-sectional view of a second embodiment of the integrated circuit packaging system along the section line 2-2 of FIG. 1.

Referring now to FIG. 3, therein is shown a cross-sectional view of a second embodiment 300 of the integrated circuit packaging system 100 along the section line 2-2 of FIG. 1. The cross-sectional view of a second embodiment 300 depicts the base package 102, showing a single metal layer substrate, having the discrete components 202 mounted on the top trace 204.

The dielectric layer 208 can be formed on the discrete components 202 to be coplanar with the top trace 204. The dielectric layer 208 can have the vias 206 formed of the conductive material, such as copper, tin, nickel, silver, gold, or an alloy thereof, for forming the filled vias 212. All of the vias shown in the second embodiment 300 are the filled vias 212. The portion of the filled vias 212 that is exposed from the dielectric layer 208, can be used as solder pads 302 for coupling the system interconnects 104. The contacts 220 can be deposited on the top trace 204 for forming a reliable connection between the top trace 204 and the component interconnects 230.

The second embodiment 300 of the integrated circuit packaging system 100 can provide a reduced size while maintaining the ability to house the first stacked integrated circuit 221 and the second stacked integrated circuit 226. The component interconnects 230 can electrically connect the first stacked integrated circuit 221, the second stacked integrated circuit 226, and the discrete components 202 through the top trace 204 and the vias 206. A connection to the next level system (not shown) can be made through the system interconnects 104 coupled directly to the vias 206.

The molded package body 232 can protect the component interconnects 230 and provide a rigid support for the base package 102. The shape of the molded package body 232 is an example only and the actual shape may differ. It is understood that the second embodiment 300 is an example of the possible configurations of the integrated circuit packaging system 100. The first stacked integrated circuit 221 and the second stacked integrated circuit 226 could be replaced by the first flip chip integrated circuit 222 without changing the features of the second embodiment 300.

Figure 4:
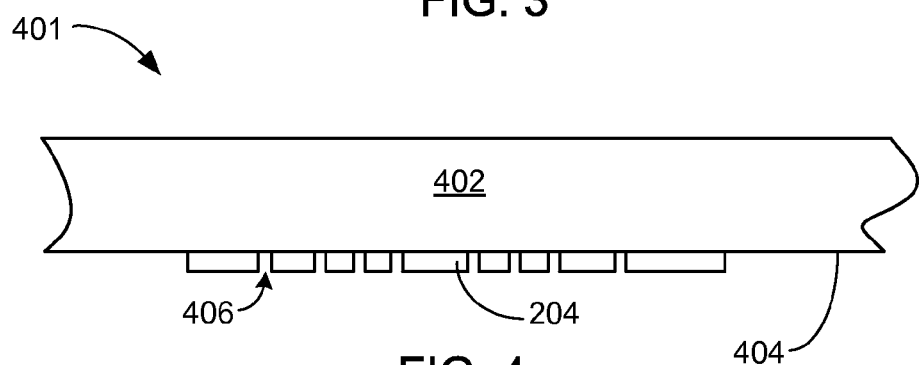
FIG. 4 is a cross-sectional view of a sub-assembly of the integrated circuit packaging system of FIG. 1 in a top trace forming phase of manufacturing.

Referring now to FIG. 4, therein is shown a cross-sectional view of a sub-assembly 401 of the integrated circuit packaging system 100 of FIG. 1 in a top trace forming phase of manufacturing. The cross-sectional view of a sub-assembly 401 depicts a manufacturing carrier 402 having the top trace layer 204 formed on a bottom planar surface 404. The top trace 204, such as a copper foil or sputtered metal layer, can be attached to the bottom planar surface 404 of the manufacturing carrier 402 and patterned to form circuit openings 406. The circuit openings 406 can provide separation of individual circuits not shown and a path for the dielectric layer to form the component surface 210 of FIG. 1 in a subsequent step. The top trace 204 can be a material that releases its adhesion with a thermal or ultrasonic stimulus, since different metals can expand or shrink at different rates, an increase or decrease in temperature can separate the top trace 204 and the manufacturing carrier 402.

It is understood that the thickness of the top trace 204 can be greater than or less that the thickness of the manufacturing carrier 402. The manufacturing carrier 402 can be formed of carbon steel, other metal, polymer, composition material, such as FR4, or the like. The top trace 204 can include thermally releasable material, or any material that can be released by an external stimulus, such as heat, vibration, chemical reaction, or a combination thereof.

It has been discovered that the manufacturing carrier 402 can provide assembly regions for multiple of the base package 102 concurrently. It is understood that the manufacturing carrier 402 can be utilized on one side or both sides without changing the claimed embodiment of the invention.

Figure 5:
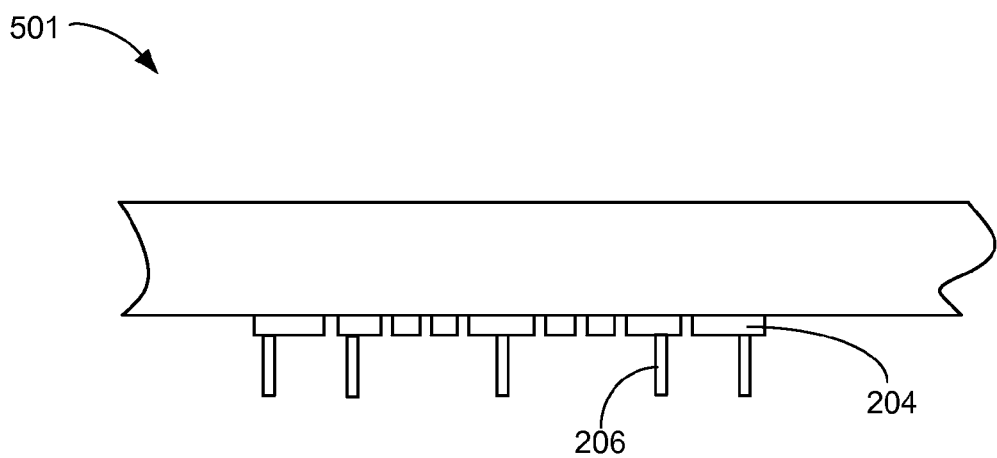
FIG. 5 is a cross-sectional view of a sub-assembly of the integrated circuit packaging system of FIG. 1 in a via forming phase of manufacturing.

Referring now to FIG. 5, therein is shown a cross-sectional view of a sub-assembly 501 of the integrated circuit packaging system 100 of FIG. 1 in a via forming phase of manufacturing. The cross-sectional view of a sub-assembly 501 depicts the top trace 204 having been patterned to provide individual regions for electrical connection within the base package 102 of FIG. 2. The vias 206 can be attached or formed by DFR and plating process to the top trace 204 in locations suitable to support the interconnect requirements of the integrated circuit packaging system 100.

It is understood that the vias 206 shown are an example only and any of the types of the vias 206 can be attached. In an optional step, some of the locations of the top trace 204 can be selectively plated with a compatible transition material between the material of the top trace 204 and the connections of the discrete components 202 of FIG. 2. It is further understood that the vias 206 can be thermally bonded, welded, formed in place, or coupled by a thermally and electrically conductive adhesive to subsequently be affixed to the top trace 204.

Figure 6:
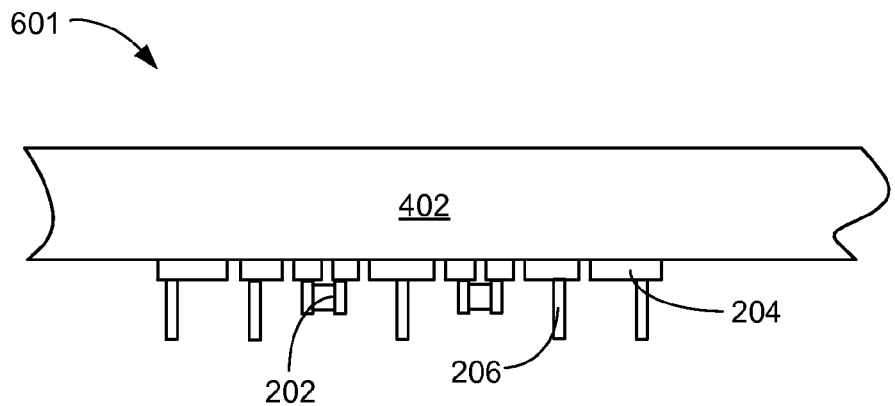
FIG. 6 is a cross-sectional view of a sub-assembly of the integrated circuit packaging system of FIG. 1 in a discrete component attaching phase of manufacturing.

Referring now to FIG. 6, therein is shown a cross-sectional view of a sub-assembly 601 of the integrated circuit packaging system 100 of FIG. 1 in a discrete component 202 attaching phase of manufacturing. The cross-sectional view of the sub-assembly 601 depicts the discrete components 202 and the vias 206 attached to the top trace 204.

It is understood that the configuration of the sub-assembly 601 can be built on both sides of the manufacturing carrier 402 at the same time. Any number of the discrete components can be attached to the top trace 204. It is further understood that several instances of the base package 102 of FIG. 2 can be constructed concurrently.

Figure 7:
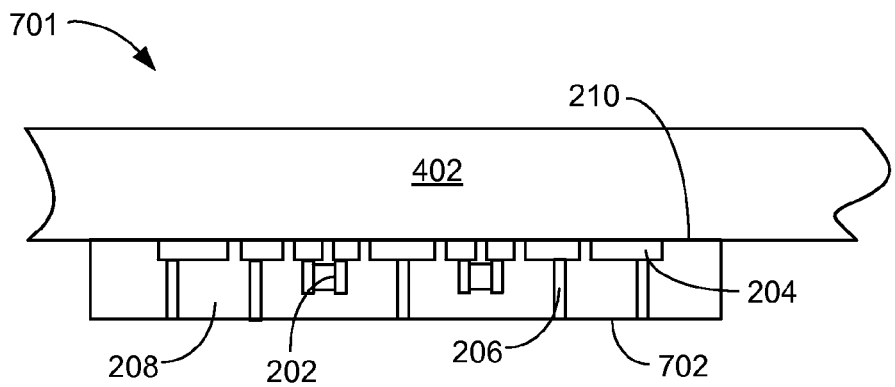
FIG. 7 is a cross-sectional view of a sub-assembly of the integrated circuit packaging system of FIG. 1 in a dielectric layer forming phase of manufacturing.

Referring now to FIG. 7, therein is shown a cross-sectional view of a sub-assembly 701 of the integrated circuit packaging system 100 of FIG. 1 in a dielectric layer 208 forming phase of manufacturing. The cross-sectional view of the sub-assembly 701 depicts the dielectric layer 208 formed on the manufacturing carrier 402, the discrete components 202, the top trace 204, and the vias 206. The component surface 210 is formed by molding the dielectric layer 208 against the manufacturing carrier 402 to be coplanar with the top trace 204.

The dielectric layer 208 can have a system surface 702 that can be formed to be coplanar with the ends of the vias 206 opposite the top trace 204. The dielectric layer 208 can be molded on the manufacturing carrier 402 to have the system surface 702 coplanar with the ends of the vias 206. The dielectric layer 208 can be formed of epoxy molding compound, two-stage epoxy, silicide, industrial glass, or other moldable, electrically-insulating material.

It is understood that the thickness of the dielectric layer 208 can be minimized in order to provide a thin package having embedded the discrete components 202. The vias 206 must be longer that the height of the discrete components 202. The layout and design of the sub-assembly 701 can provide flexible designs that are able to be produced in high volume with great flexibility.

Figure 8:
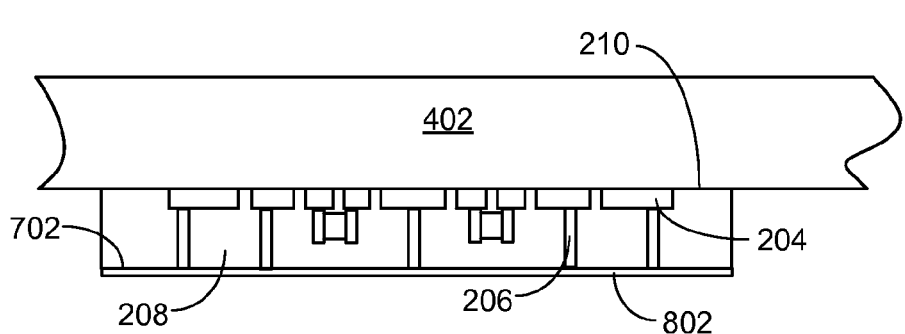
FIG. 8 is a cross-sectional view of a sub-assembly of the integrated circuit packaging system of FIG. 1 in a seed layer deposition phase of manufacturing.

Referring now to FIG. 8, therein is shown a cross-sectional view of a sub-assembly 801 of the integrated circuit packaging system 100 of FIG. 1 in a seed layer 802 deposition phase of manufacturing. The cross-sectional view of sub-assembly 801 depicts the manufacturing carrier 402 having the top trace 204 and the dielectric layer 208 forming the component surface 210. The system surface 702 can have the seed layer 802 deposited thereon.

The seed layer 802 can be applied by plating, sputtering, silk screening, or spray-on deposition. The seed layer 802 can be formed of copper, nickel, tin, silver, or an alloy thereof.

The application of the seed layer 802 can add structural rigidity to the sub-assembly 801 because the seed layer 802 can be electrically and structurally coupled to all of the vias 206 exposed from the system surface 702.

Figure 9:
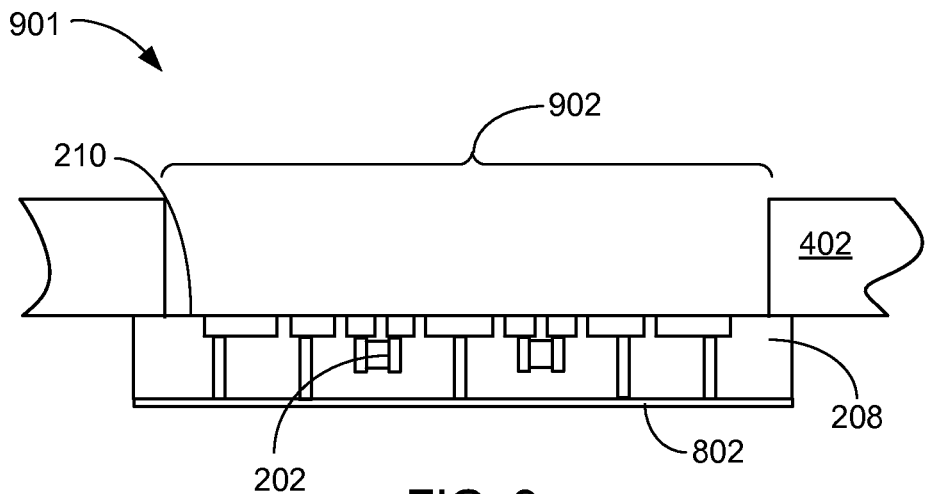
FIG. 9 is a cross-sectional view of a sub-assembly of the integrated circuit packaging system of FIG. 1 in a carrier sectioning phase of manufacturing.

Referring now to FIG. 9, therein is shown a cross-sectional view of a sub-assembly 901 of the integrated circuit packaging system 100 of FIG. 1 in a carrier sectioning phase of manufacturing. The cross-sectional view of the sub-assembly 901 depicts the manufacturing carrier 402 having an access opening 902 formed in the manufacturing carrier 402. The removal of the access opening 902 can be performed by laser ablation, sawing, chemical etching, or the like. The region of the component surface 210 exposed by the removal of the access opening 902 can be further processed and tested to verify the function provided by the discrete components 202.

The dielectric layer 208 can remain attached to the manufacturing carrier 402 to enable handling and manipulation of the sub-assembly 901. The seed layer 802 can provide structural support during this phase of manufacturing.

Figure 10:
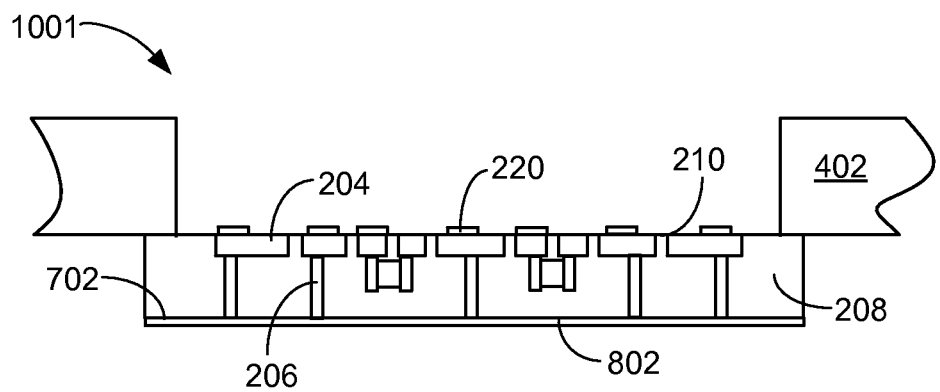
FIG. 10 is a cross-sectional view of a sub-assembly of the integrated circuit packaging system in a top contact deposition phase of manufacturing.

Referring now to FIG. 10, therein is shown a cross-sectional view of a sub-assembly 1001 of the integrated circuit packaging system 100 of FIG. 1 in a top contact deposition phase of manufacturing. The cross-sectional view of a sub-assembly 1001 depicts the component surface 210 exposed from the manufacturing carrier 402. The contacts 220 can be deposited on selective locations of the top trace 204. The contact 220 assures a strong mechanical and electrical connection can be made to the top trace 204.

It has been discovered that the seed layer 802 completely covering the system surface 702 of the dielectric layer 208 can provide structural support for the dielectric layer 208 during the deposition of the plurality of the contact 220. The seed layer 802 connection to all of the vias 206 can assure that the discrete components are protected from damage caused by static electricity because all of the top trace 204 eventually leads to one of the vias 206, which are all at the same electrical potential and are shorted together by the seed layer 802.

Figure 11:
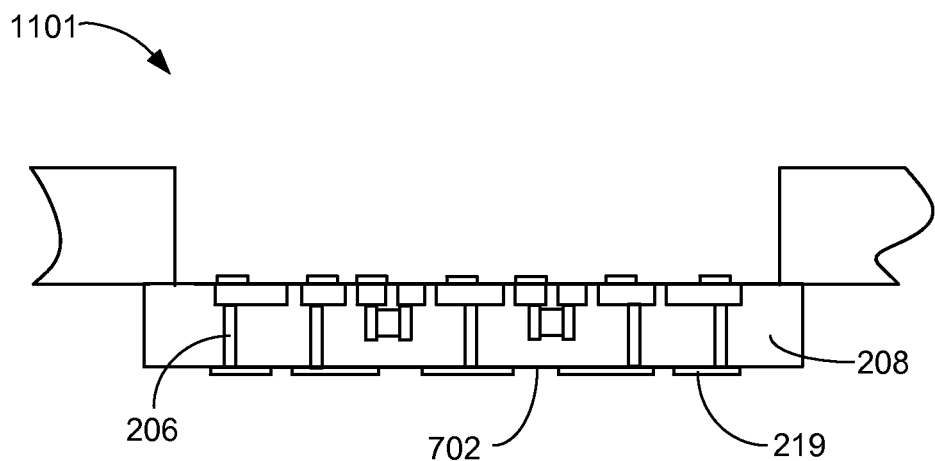
FIG. 11 is a cross-sectional view of a sub-assembly of the integrated circuit packaging system of FIG. 1 in a bottom trace patterning phase of manufacturing.

Referring now to FIG. 11, therein is shown a cross-sectional view of a sub-assembly 1101 of the integrated circuit packaging system 100 of FIG. 1 in a bottom trace 219 patterning phase of manufacturing. The cross-sectional view of the sub-assembly 1101 depicts the seed layer 802 of FIG. 8 can be patterned to form the bottom trace 219 for individual circuits for the first embodiment of the integrated circuit packaging system 100. The bottom trace 219 can provide additional capability to relocate electrical connections to the system interconnects 104 of FIG. 1.

It is understood that the second embodiment of the integrated circuit packaging system 100 can have all of the seed layer 802 removed to exposed the system surface 702. The system surface 702 is coplanar with the ends of the vias 206, which are exposed from the dielectric layer 208.

Figure 12:
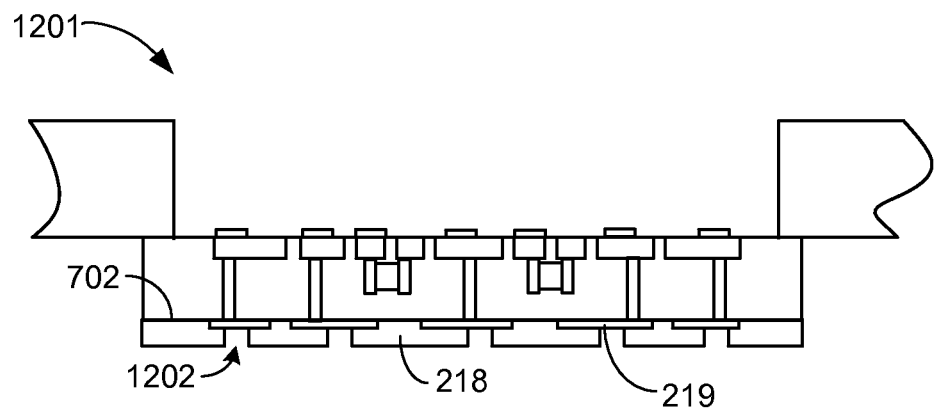
FIG. 12 is a cross-sectional view of a sub-assembly of the integrated circuit packaging system of FIG. 1 in a solder mask deposition phase of manufacturing.

Referring now to FIG. 12, therein is shown a cross-sectional view of a sub-assembly 1201 of the integrated circuit packaging system 100 of FIG. 1 in a solder mask deposition phase of manufacturing. The cross-sectional view of the sub-assembly 1201 depicts the solder mask 218 deposited on the system surface 702 and the bottom trace 219. A system coupling port 1202 can be patterned in the solder mask 218 for attaching the system interconnects 104 of FIG. 1.

It has been discovered that the deposition of the solder mask 218 can add to the rigidity of the dielectric layer 208. The addition of the solder mask 218 can allow the bottom trace 219 to be routed in close proximity to the system coupling port 1202 with no risk of an inadvertent solder short to the individual circuits represented by the bottom trace 219.

Thus, it has been discovered that the integrated circuit packaging system and device or product of the embodiments of the present invention furnish important and heretofore unknown and unavailable solutions, capabilities, and functional aspects for manufacturing high volume flexible and reliable multi chip integrated circuit packages with thermal management features.

Figure 13:
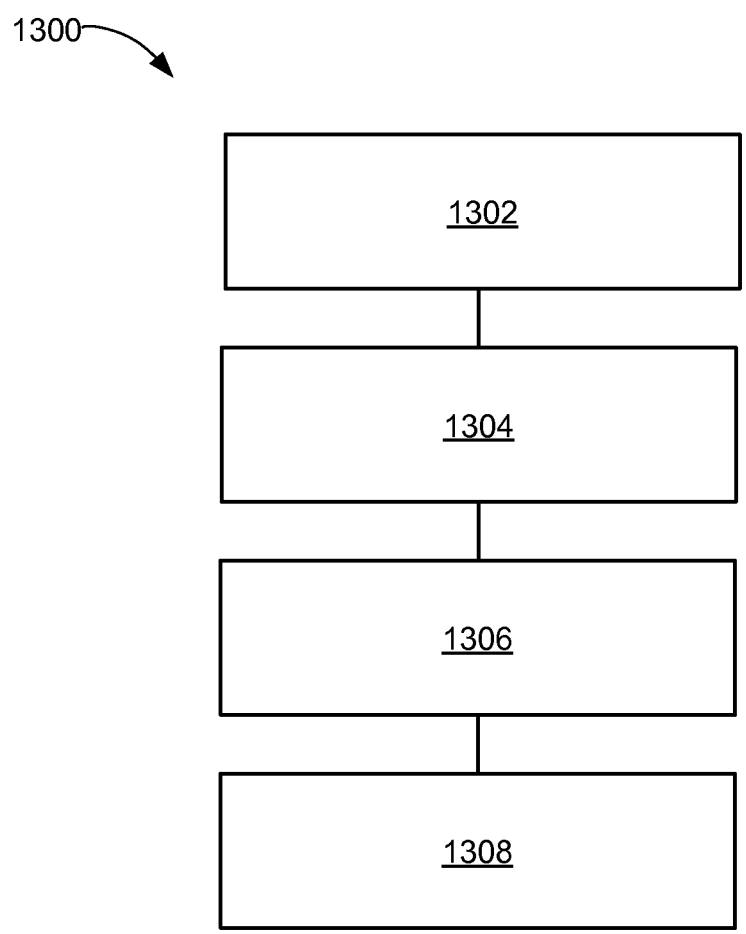
FIG. 13 is a flow chart of a method of manufacture of an integrated circuit packaging system in a further embodiment of the present invention.

Referring now to FIG. 13, therein is shown a flow chart of a method of manufacture of an integrated circuit packaging system in a further embodiment of the present invention. The method 1300 includes: depositing a top trace on a manufacturing carrier in a block 1302; attaching discrete components on the top trace opposite the manufacturing carrier in a block 1304; mounting vias on the top trace separated from the discrete components in a block 1306; and forming a dielectric layer on the top trace, the discrete components, and the vias, including forming a component surface in a block 1308.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    depositing a top trace on a manufacturing carrier;
    attaching discrete components on the top trace opposite the manufacturing carrier;
    mounting vias on the top trace separated from the discrete components;
    forming a dielectric layer on the top trace, the discrete components, and the vias, including forming a component surface having the dielectric layer coplanar with the top trace;
    mounting a stacked integrated circuit over the component surface and directly above the discrete components positioned under the component surface;
    forming a solder mask covering a system surface of the dielectric layer opposite to the component surface, the solder mask includes a coupling port below each of the vias; and
    mounting system interconnects below the solder mask and coupled to the vias for electrically connecting the top trace, the discrete components, or a combination thereof to the system interconnects.

2. The method as claimed in claim 1 further comprising forming a system surface having the dielectric layer coplanar with an end of the vias exposed from the dielectric layer.

3. The method as claimed in claim 1 further comprising depositing contacts on the top trace above the component surface.

4. The method as claimed in claim 1 further comprising:
coupling a component contact between the stacked integrated circuit and the discrete components; and
forming a molded package body on the stacked integrated circuit, the component contact, and the component surface.

5. The method as claimed in claim 1 further comprising:
patterning a bottom trace on a system surface includes coupling the bottom trace to the vias.

6. A method of manufacture of an integrated circuit packaging system comprising:
depositing a top trace on a manufacturing carrier including patterning circuit openings in the top trace;
attaching discrete components on the top trace opposite the manufacturing carrier;
mounting vias on the top trace separated from the discrete components by the circuit opening;
forming a dielectric layer on the top trace, the discrete components, and the vias, including forming a component surface having the dielectric layer coplanar with the top trace;
mounting a stacked integrated circuit over the component surface and directly above the discrete components positioned under the component surface including depositing a contact on the top trace above the discrete components;
depositing a solder mask covering a system surface of the dielectric layer opposite to the component surface, the solder mask includes a coupling port below each of the vias; and
mounting system interconnects below the solder mask and coupled to the vias for electrically connecting the top trace, the discrete components, or a combination thereof to the system interconnects.

7. The method as claimed in claim 6 further comprising forming a system surface having the dielectric layer coplanar with an end of the vias exposed from the dielectric layer includes forming a base package by coupling a system interconnect to the vias.

8. The method as claimed in claim 6 further comprising depositing contacts on the top trace above the component surface includes accessing an access opening in the manufacturing carrier.

9. The method as claimed in claim 6 further comprising:
coupling a component contact between the stacked integrated circuit and the discrete components including directly connecting the component contact to the contact and the stacked integrated circuit; and
forming a molded package body on the stacked integrated circuit, the component contact, the component surface, and the contact.

10. The method as claimed in claim 6 further comprising:
patterning a bottom trace on a system surface includes coupling the bottom trace to the vias; and
wherein:
coupling the bottom trace to the vias includes coupling the bottom trace to filled vias, open vias, a heat slug, or a combination thereof.

11. An integrated circuit packaging system comprising:
discrete components coupled to a top trace;
vias attached to the top trace separated from the discrete components;
a dielectric layer on the top trace, the discrete components, and the vias, includes a component surface, formed above the discrete components, with the top trace coplanar with the dielectric layer;
a stacked integrated circuit mounted over the component surface and directly above the discrete components positioned under the component surface;
a solder mask covering a system surface of the dielectric layer opposite to the component surface, the solder mask includes a coupling port below each of the vias; and
system interconnects below the solder mask and coupled to the vias for electrically connecting the top trace, the discrete components, or a combination thereof to the system interconnects.

12. The system as claimed in claim 11 further comprising a system surface formed by the dielectric layer coplanar with an end of the vias exposed from the dielectric layer.

13. The system as claimed in claim 11 further comprising contacts deposited on the top trace above the component surface.

14. The system as claimed in claim 11 further comprising:
a component contact coupled between the stacked integrated circuit and the top trace; and
a molded package body formed on the stacked integrated circuit, the component contact, the component surface, and the top trace.

15. The system as claimed in claim 11 further comprising:
a bottom trace on a system surface includes the bottom trace coupled to the vias.

16. The system as claimed in claim 11 further comprising circuit openings patterned in the top trace.

17. The system as claimed in claim 16 further comprising a system surface formed by the dielectric layer coplanar with an end of the vias exposed from the dielectric layer includes a base package formed by the system interconnects coupled to the vias.

18. The system as claimed in claim 16 further comprising contacts on the top trace above the component surface includes a contact over the discrete components.

19. The system as claimed in claim 16 further comprising:
a contact over the discrete components;
a first flip chip integrated circuit, a second flip chip integrated circuit, the stacked integrated circuit, or a combination thereof over the contact;
a component contact between the stacked integrated circuit, the first flip chip integrated circuit, the second flip chip integrated circuit, or the combination thereof and the contact; and
a molded package body on the stacked integrated circuit, the first flip chip integrated circuit, the second flip chip integrated circuit, or the combination thereof, the component contact, the contact, and the component surface.

20. The system as claimed in claim 16 further comprising:
a bottom trace on a system surface includes the bottom trace coupled to the vias; and
wherein:
the bottom trace coupled to the vias includes the bottom trace coupled to filled vias, open vias, a heat slug, or a combination thereof.

* * * * *